United States Patent
Xuan et al.

(10) Patent No.: US 8,956,937 B2
(45) Date of Patent: Feb. 17, 2015

(54) METHOD OF DEPOSITING THE METAL BARRIER LAYER COMPRISING SILICON DIOXIDE

(71) Applicant: Shanghai Huali Microelectronics Corporation, Pudong, Shanghai (CN)

(72) Inventors: GuoFang Xuan, Shanghai (CN); Fei Luo, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 14/069,570

(22) Filed: Nov. 1, 2013

(65) Prior Publication Data
US 2014/0273364 A1    Sep. 18, 2014

(30) Foreign Application Priority Data
Mar. 14, 2013 (CN) .......................... 2013 1 0081930

(51) Int. Cl.
 *H01L 21/336* (2006.01)
 *H01L 21/8234* (2006.01)
 *H01L 21/02* (2006.01)
 *H01L 29/66* (2006.01)

(52) U.S. Cl.
 CPC .... *H01L 21/02164* (2013.01); *H01L 29/66477* (2013.01)
 USPC ........... 438/197; 438/514; 438/527; 438/530; 438/765; 257/E21.279; 257/E21.619

(58) Field of Classification Search
 None
 See application file for complete search history.

(56) References Cited

U.S. PATENT DOCUMENTS

| 2003/0022473 | A1* | 1/2003 | Matsumoto et al. | 438/514 |
| 2003/0124872 | A1* | 7/2003 | Li et al. | 438/765 |
| 2009/0273008 | A1* | 11/2009 | Moon | 257/225 |
| 2010/0171420 | A1* | 7/2010 | Akiyama et al. | 313/582 |

FOREIGN PATENT DOCUMENTS

| CN | 1190830 | 2/2005 |
| CN | 102176414 | 9/2011 |
| CN | 102543716 | 7/2012 |

* cited by examiner

*Primary Examiner* — Wael Fahmy
*Assistant Examiner* — Abdulfattah Mustapha
(74) *Attorney, Agent, or Firm* — Duane Morris LLP; J. Rodman Steele, Jr.; Gregory M. Lefkowitz

(57) ABSTRACT

The present invention discloses to a method of depositing the metal barrier layer comprising silicon dioxide. It is applied in the transistor device comprising a silicon substrate, a gate and a gate side wall. The method comprises the following steps: ions are implanted into the silicon substrate to form an active region in the said silicon substrate; a first dense silicon dioxide film is deposited; a second normal silicon dioxide film is deposited; the said transistor device is high temperature annealed. The present invention ensures that the implanted ion is not separated out of the substrate during the annealing. And it prevents the warping and fragment of the silicon surface.

11 Claims, 4 Drawing Sheets

METHOD OF DEPOSITING THE METAL BARRIER LAYER COMPRISING SILICON DIOXIDE

CROSS-REFERENCE TO RELATED APPLICATIONS

The present application claims priority under the Paris Convention to Chinese application number CN 201310081930.X, filed on Mar. 14, 2013, the disclosure of which is herewith incorporated by reference in its entirety.

FIELD OF THE INVENTION

The present invention relates to the CMOS semiconductor industry, in particular it relates to a method of depositing the metal barrier layer comprising silicon dioxide.

BACKGROUND OF THE INVENTION

The metal silicide process is the standard process in the semiconductor industry. Presently, the normal flow of the metal silicide process is that as follows. Firstly, high dose ions are implanted to form source and drain. Then, a silicon dioxide film of 50 Å to 150 Å in thickness is formed. The high temperature annealing process is performed. A relatively thicker layer of silicon nitride film is formed at the surface of the silicon dioxide film. During the high temperature annealing process, the ion which is implanted into the substrate is activated, and the surface of the substrate is repaired. The relatively thicker layer of silicon nitride film is deposited. The barrier layer is etched. The etching stops at the silicon dioxide film, and the wet etching method is adopted. In this method, the lateral etch of the barrier layer is reduced. Finally, the process of metal silicide is performed.

The disadvantage of the process is that the density of the silicon dioxide film is not enough. The covering ability of the film is low. During the process of high temperature anneal, a big amount of the implanted ions are separated out from the substrate, especially for the fluorine ions which is implanted in PMOS to enhance the reliability of the device. It causes the drift of the characteristics of the device. Seriously, it even causes that the silicon dioxide film is raised by the separated ions which forms the defect of bubble and even the peeling thereof. If the silicon dioxide film is thickened, the lateral etching will become too much during the wet etching of the subsequent metal silicide barrier layer. And the side tracking of the metal silicide will also become too much. However, if the high temperature annealing process is postponed after the process of silicon nitride film, the temperature of the silicide surface will not be enough and the annealing will not be complete.

FIG. 1 is a flow chat of the process of metal silicide in the prior art. As shown in FIG. 1, the process of forming the barrier layer in the prior art comprises the steps as follows. Firstly, ion is implanted into the NMOS to form the source and drain. Then ion is implanted into the PMOS to form the source and drain, and at the same time the fluorine ion is implanted into the PMOS. A metal silicide barrier layer comprising silicon dioxide is deposited. The RTA process is performed. During the process, the fluorine ions will be separated out from the substrate. Finally, a metal silicide barrier layer comprising silicon nitride is deposited.

Chinese Patent (CN 102543716A) disclosed a method of forming the metal silicide barrier layer, the method comprises the steps as follows. A substrate comprising STI is provided. There are a first gate structure and a second gate structure disposed at two side of the substrate. The lightly doped drain source regions are located at the two side of the substrate of the first gate structure. And then, a silicon dioxide of rich silicon is deposited. Ions are implanted into the two side of the first gate structure to form a heavily doped drain and source region. A silane layer is deposited. The photoresist is coated. The photoresist is photoetched to form a first window, where the first gate structure is exposed. The silane layer is removed by dry etching method. The silicon dioxide of rich silicon which is in the first window is removed by wet etching method. Then the photoresist is removed.

Chinese Patent (CN 1190830C) discloses a method of forming the conductor comprising the metal silicide. The method at least comprises the steps as follows. A substrate which is covered by the rough semiconductor structure is provided. A silicon layer and a metal layer are formed on the semiconductor structure in sequence. A covering layer is formed onto the metal layer. A thermal treatment is performed to having the metal layer and silicon layer to react a metal silicide layer. The thermal stability of the metal silicide layer is worse than the covering layer. And then the metal silicide is transformed into several conductors comprising metal silicide by adopting the process of pattern transfer program.

Chinese Patent (CN 102176414A) discloses a method of forming metal silicide, which comprises the steps as follows. A first heating process is performed before forming the metal silicide on the silicon substrate. The remaining moisture in the silicon substrate, caused by surface washing process, is removed. The metal silicide which is close to the edge of the oxide layer isolation structure is prevented to be thinner. The low resistance metal silicide can be formed on the gate and on the small linewidth source and drain.

With widely applications of forming the metal barrier layer and the high temperature annealing in manufacturing the semiconductor, the above mentioned problem needs to be solved timely.

SUMMARY OF THE INVENTION

Due to the defects of the traditional art, the present invention discloses a method of depositing the metal barrier layer comprising silicon dioxide process comprising:

A method of depositing the metal barrier layer comprising silicon dioxide, which is applied to a silicon substrate with the active region, a gate is disposed on the upper surface of the said silicon substrate, wherein the method comprises the following steps:

Ion is implanted into the silicon substrate to form an active region in the said silicon substrate;

A first silicon dioxide film is deposited to cover the exposed upper surface of the said silicon substrate and the said gate;

A second silicon dioxide film is deposited to cover the upper surface of the first silicon dioxide film;

The high temperature annealing process is continuously performed;

wherein, the depositing rate of the said first silicon dioxide film is lower than that of the said second silicon dioxide film.

According to the above method, wherein the method further comprises:

After the high temperature annealing process, a silicon nitride film is produced to cover the upper surface of the said second silicon dioxide film;

A photo etching process is performed to selectively expose the said silicon nitride film;

The said silicon nitride film is etched back till the upper surface of the second silicon dioxide film;

The said second silicon dioxide film is etched back till upper surface of the first silicon dioxide film;

The said first silicon dioxide film is etched back till the surface of the top of the said gate and till the upper surface of the said silicon substrate;

A metal silicide is produced to cover the exposed surface of the said silicon substrate and the exposed surface of the top of the said gate.

According to the above method, wherein the thickness of the said silicon nitride film ranges from 200 Å to 300 Å.

According to the above method, wherein the thickness of the said first silicon dioxide film ranges from 50 Å to 150 Å;

According to the above method, wherein the said second silicon dioxide film is thicker than that of the said first silicon dioxide film.

According to the above method, wherein the refractive index of the said first silicon dioxide film ranges from 1.8 to 2.0

According to the above method, wherein the refractive index of the second silicon dioxide film ranges from 1.46 to 1.50.

According to the above method, wherein the said silicon nitride film is etched back by dry etching method.

According to the above method, wherein the said second silicon dioxide film is etched back by wet etching method.

According to the above method, wherein the said first silicon dioxide film is etched back by wet etching method.

According to the above method, wherein the first silicon dioxide film is produced by the sol gel process.

According to the above method, wherein the raw material of the said sol gel process is tetraethoxysilane ("TEOS", hereinafter).

The advantageous effects of the above technical solution are as follows:

The method of the present invention uses the step-by-step depositing the silicon dioxide metal barrier layers. It controls the depositing rate. The depositing rate of first layer of silicon dioxide film is lower than that of the second layer. The first layer is denser than the second layer, which ensures it not easy for the implanted ions to be separated out during other subsequent high temperature annealing process. The problems of bubbles and peelings of the silicon dioxide films are solved. Meanwhile, it solved the problems of warping and fragment of the silicon dioxide film surface due to too large surface stress due to the over big density in full depositing of the traditional method.

DETAILED DESCRIPTION OF THE PREFERRED EMBODIMENT

The present invention will be further illustrated in combination with the following figures and embodiments, but it should not be deemed as limitation of the present invention.

The present invention provides a method of depositing the metal barrier layer, in particular, is a method of depositing the metal barrier layer comprising silicon dioxide.

The method of the present invention can be applied in the process of manufacturing the semiconductor, whose the technology node is 40 nm, 45 nm, 55 nm, 65 nm, 90 nm or more than 130 nm, and whose technology platform of the present invention is Logic and Memory.

Figure 1:
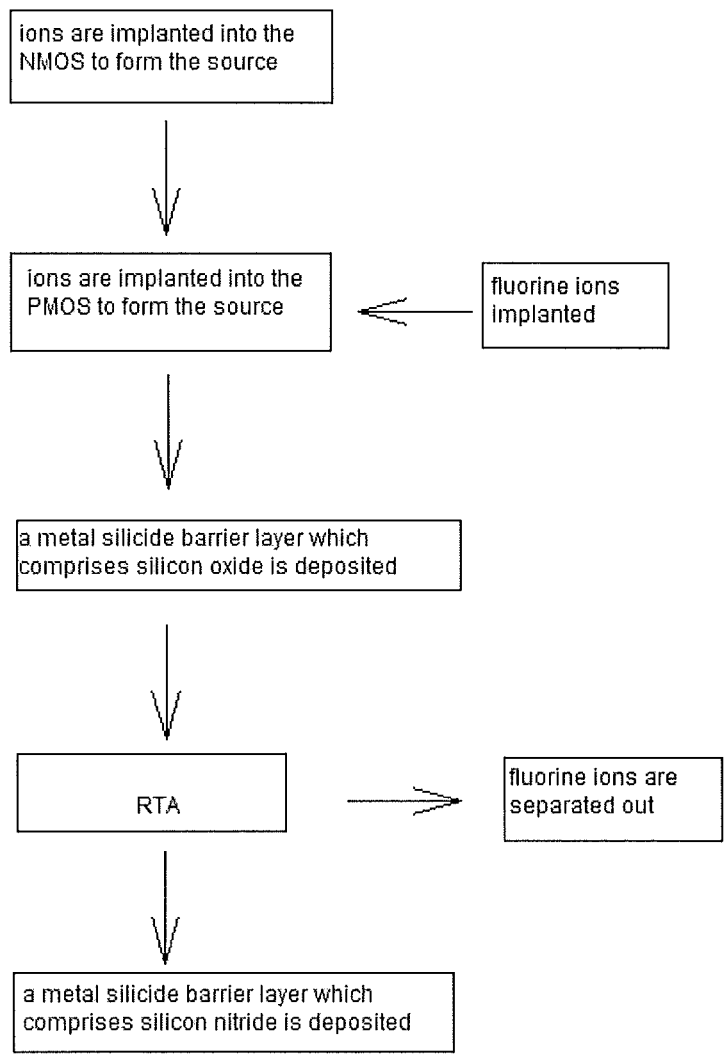
FIG. 1 is a flow chat of the process of metal silicide in the prior art.
Figure 2A:
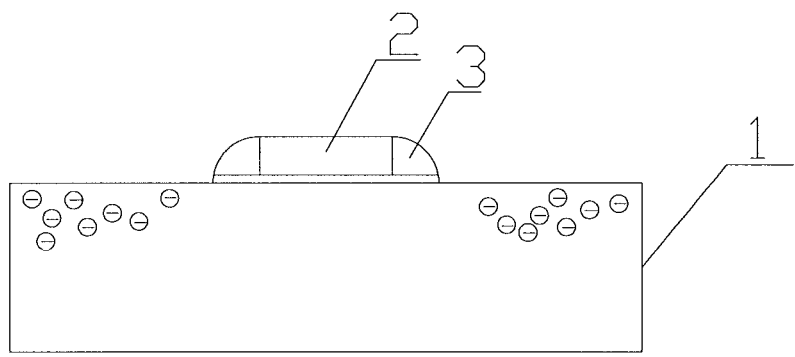
FIG. 2A is the structure diagram of the device before the process in the embodiment of the present invention.

The embodiment of the present invention is elaborated as follows:

FIG. 2A is the structure diagram of the device before the process in the embodiment of the present invention. As shown in FIG. 2A, the method of the present invention is applied in the structure of a transistor which comprises a Silicon Substrate 1, a Gate 2 and a Side Wall 3 of the gate.

Ions are implanted into Silicon Substrate 1 to form an active region. At the same time of the implantation in PMOS, A high dose of fluorine ions are implanted, where the dose shall be more than 1E15/cm2. The high dose implantation of ions with is essential and necessary to improve the reliability of the transistor.

Figure 2B:
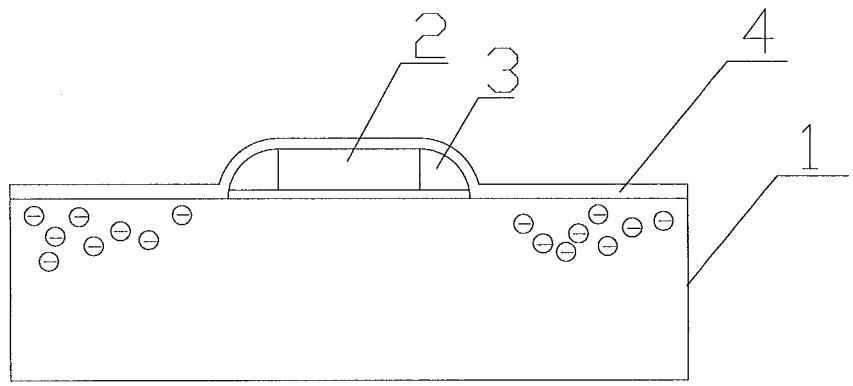
FIG. 2B is the structure diagram of the device which has been deposited by the first silicon dioxide film in the embodiment of the present invention.

FIG. 2B is the structure diagram of the device which has been deposited by the first silicon dioxide film in the embodiment of the present invention. As shown in FIG. 2B, Firstly, a First Silicon Dioxide Film 4 is formed to cover the upper surface of Silicon Substrate 1 implanted with fluorine ions, the surface of Gate 2 and the surface of the Side Wall 3 of the gate. The thickness of the first silicon dioxide shall be in a scope of 50 Å to 150 Å, wherein the thickness in the scope can be 50 Å, 150 Å, 60 Å, 80 Å, or 110 Å, etc. And the first silicon dioxide film is dense. The refractive index of the first silicon dioxide film shall be from 1.8 to 2.0, for example, value of the refractive index can be 1.8, 1.9, or 2.0, etc. The refractive index value of the first silicon dioxide film is close to the refractive index of the normal silicon nitride so that the covering capability of the first silicon dioxide film is larger than that of the silicon dioxide film which is ordinary in density.

Figure 2C:
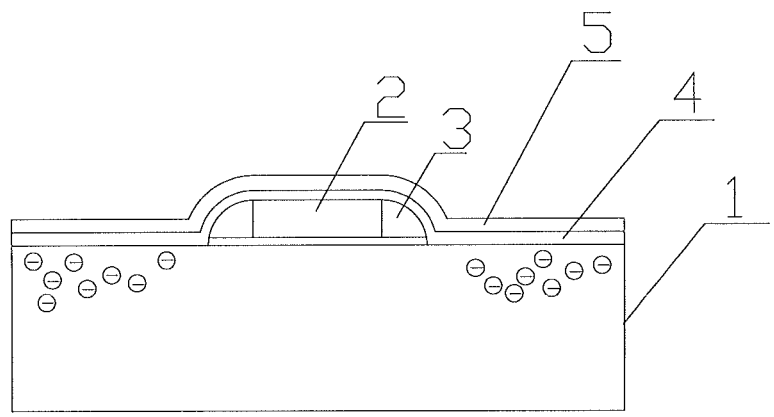
FIG. 2C is the structure diagram of the device which has been deposited by the second silicon dioxide film in the embodiment of the present invention.

FIG. 2C is the structure diagram of the device which has been deposited by the second silicon dioxide film in the embodiment of the present invention. As shown in FIG. 2C, a Second Silicon Dioxide Film 5 shall be formed at the upper surface of the First Silicon Dioxide Film 4. The refractive index of the second silicon dioxide film shall be from 1.46 to 1.50, for example, 1.46, 1.50, or 1.48, etc. The second silicon dioxide film can be formed by the process(es) of the sol gel coating, the chemical vapor deposition, the physical vapor deposition or thermal oxidation, etc. The preferably, the raw material of the said sol gel process is TEOS. The thickness of Second Silicon Dioxide Film 5 shall be larger than that of First Silicon Dioxide Film 4.

During the process of depositing First Silicon Dioxide 4 and Second Silicon Dioxide 5, the depositing rate of First Silicon Dioxide 4 is lower than that of Second Silicon Dioxide 5.

Figure 2D:
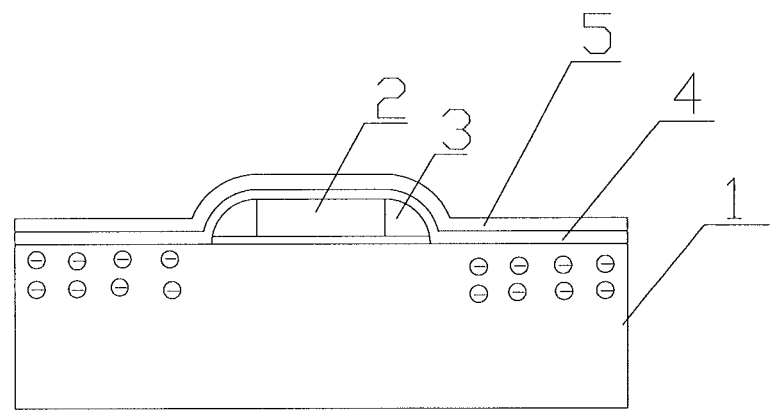
FIG. 2D is the structure diagram of the device which has been performed the high temperature annealing process in the embodiment of the present invention.

FIG. 2D is the structure diagram of the device which has been performed the high temperature annealing process in the embodiment of the present invention. As shown in FIG. 2D, the device which has formed First Silicon Dioxide Film 4 and Second Silicon Dioxide Film 5 are annealed to repair the surface of the silicon and to active the ions implanted. The temperature of anneal shall be above 1000° C. A dense First Silicon Dioxide Film 4 are covering Silicon Substrate 1, Gate 2 and Side Wall 3. That it can effectively prevent the implanted ions are separated out during the high temperature annealing process. The problems of bubbles and peelings of the silicon dioxide films are solved.

Figure 2E:
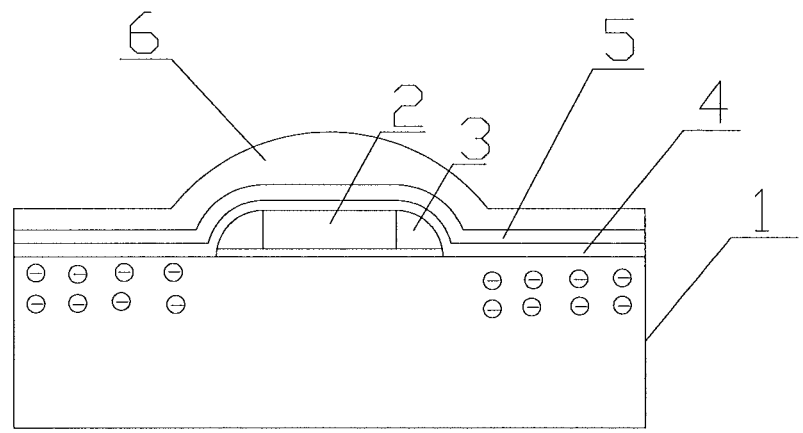
FIG. 2E is the structure diagram of the device which has been formed a silicon nitride film in the embodiment of the present invention.

FIG. 2E is the structure diagram of the device which has been formed a silicon nitride film in the embodiment of the present invention. As shown in FIG. 2E, a relatively thicker Silicon Nitride Film 6 is deposited at the upper surface of Second Silicon Dioxide Film 5. Silicon Nitride Film 6 covers the upper surface of Second Silicon Dioxide Film 5. The thickness of Silicon Nitride Film 6 shall be from 200 Å to 300 Å, for example, 200 Å, 300 Å, or 240 Å, etc.

Figure 2F:
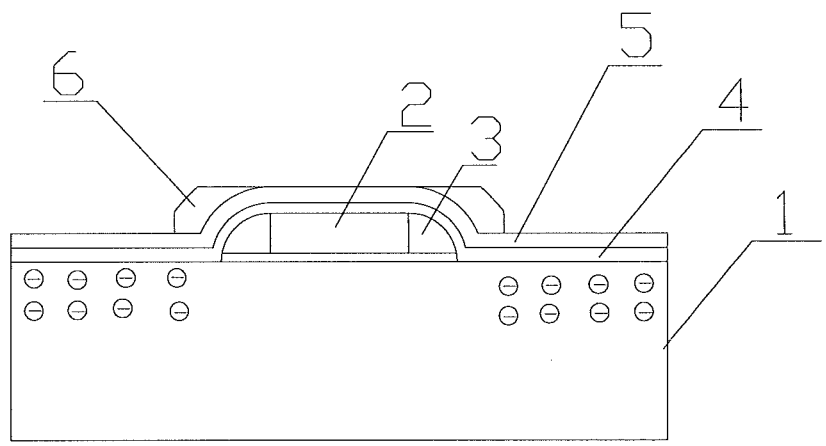
FIG. 2F is the structure diagram of the device which has been partially removed of the silicon nitride film in the embodiment of the present invention.

FIG. 2F is the structure diagram of the device which has been partially removed of the silicon nitride film in the embodiment of the present invention.

As shown in FIG. 2F, Silicon Nitride Film 6 is performed the photo etching process to selectively expose the said film for the purpose of acquire the pattern needed. The exposed Silicon Nitride Film 6 is performed the dry etching method. The etching stops at Second Silicon Dioxide Film 5. The Silicon Nitride Film 6 is partially etched. The undesired part of Silicon Nitride Film 6 is removed, and the desired part thereof is remained. The Silicon Nitride Film 6 can be etched partially or entirely according to the process requirement.

Figure 2G:
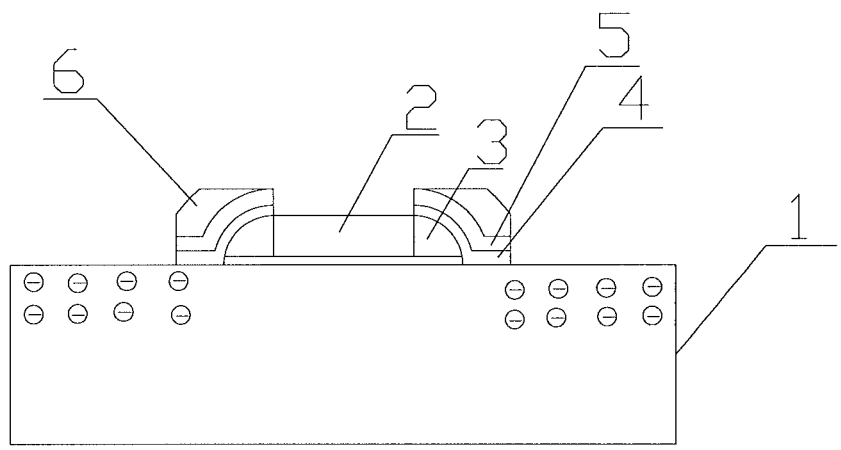
FIG. 2G is the structure diagram of the device which has been partially removed the first silicon dioxide film and the second oxide film in the embodiment of the present invention.

FIG. 2G is the structure diagram of the device which has been partially removed the first silicon dioxide film and the second oxide film in the embodiment of the present invention. As shown in FIG. 2G, the first silicon dioxide film and the second silicon dioxide film is performed the wet etching process. The exposed First Silicon Dioxide Film 4 and the second silicon dioxide film are partially removed. And the parts of the first silicon dioxide film and second silicon dioxide film which are covered by the remaining silicon nitride film is remained.

Figure 2H:
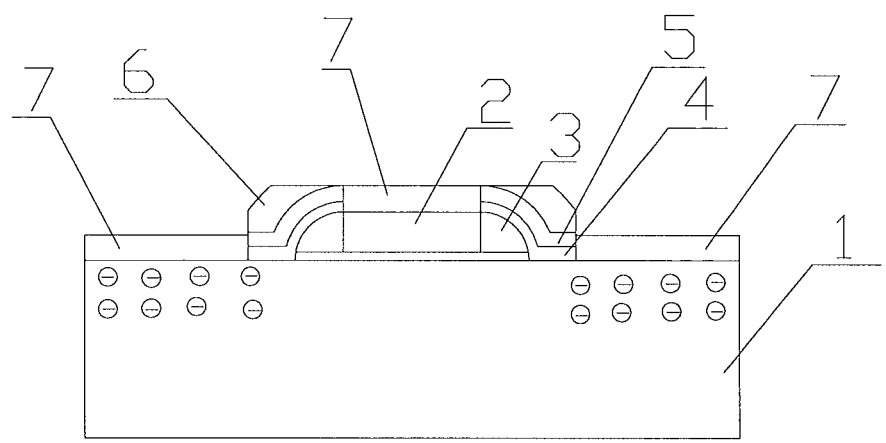
FIG. 2H is the structure diagram of the device which has been formed the metal silicide in the embodiment of the present invention.

FIG. 2H is the structure diagram of the device which has been formed the metal silicide in the embodiment of the present invention. As shown in FIG. 2H, the layer of Metal Silicide 7 is formed at the surface of the exposed part of Silicon Substrate 1 and Gate 2. The exposed surface of Gate 2 and Silicon Substrate 1 are covered by the layer of Metal Silicide 7. Metal Silicide 7 is produced as follows. The metal of Ni is deposited at the exposed surface of Gate 2 and Silicon Substrate 1. Two times of high temperature annealing process are formed to have Ni and the exposed Si reacted into low resistance Metal Silicide 7.

In conclusion, the method of the present invention comprises that forming a thin and dense layer of silicon dioxide film covering the exposed parts of Silicon Substrate 1, Gate 2 and Side Wall 3, and then forming a thicker and normal dense silicon dioxide film at the surface of the thinner silicon dioxide film. The structure of the two layers of silicon dioxide makes that the implanted ions in Silicon Substrate 1 will not be separated out of the substrate in the high temperature annealing process. Meanwhile the surface stress of the silicon will not be too large. The problems of bubbles and peelings of the silicon dioxide films are solved.

Although a typical embodiment of a particular structure of the specific implementation way has been given with the above description and the figures, it is appreciated that other changes based on the spirit of this invention may also be made. Though the preferred embodiments are proposed above, these contents will never be the limitation of this invention.

It is obvious for the skilled in the art to make varieties of changes and modifications after reading the above descriptions. Hence, the claims attached should be regarded as all the changes and modifications which cover the real intention and the range of this invention. Any and all equivalent contents and ranges in the range of the claims should be regarded belonging to the intention and the range of this invention.

The invention claimed is:

1. A method of depositing the metal barrier layer comprising silicon dioxide, which is applied in a silicon substrate, a gate is disposed at the upper surface of the said silicon substrate, wherein the method comprises the following steps:

ions, including a dose of fluorine, are implanted into the silicon substrate to form an active region of a PMOS transistor in the said silicon substrate, wherein fluorine ions are implanted in the silicon substrate in a dose of more than $1\times10^{15}$ /cm$^2$;

a first silicon dioxide film is deposited to cover the exposed upper surface of the said silicon substrate and the said gate;

a second silicon dioxide film is deposited to cover the upper surface of the first silicon dioxide film;

a high temperature annealing process is continuously performed;

wherein, the depositing rate of the said first silicon dioxide film is lower than that of the said second silicon dioxide film, wherein the first silicon dioxide film is denser than the second silicon dioxide film, wherein the first silicon dioxide film effectively prevents the implanted fluorine ions from being separated out during the annealing process.

2. The method according to claim 1, wherein the method further comprises:

after the said high temperature annealing, a silicon nitride film is produced to cover the upper surface of the said second silicon dioxide film;

the said silicon nitride film is photo etched to expose itself partly;

a photo etching process is performed to selectively expose the said silicon nitride film;

the said silicon nitride film is etched back till the upper surface of the second silicon dioxide film;

the said second silicon dioxide film and the said first silicon dioxide film are etched back till the surface of the top of the said gate and the upper surface of the said silicon substrate;

a metal suicide is produced to cover the exposed surface of the said silicon substrate and the exposed surface of the top of the said gate.

3. The method according to claim 2, wherein the thickness of the said silicon nitride film ranges from 200 Å to 300 Å.

4. The method according to claim 2, wherein the said silicon nitride film is etched back by dry etch process.

5. The method according to claim 2, wherein the said second silicon dioxide film is etched back by wet etch process.

6. The method according to claim 2, wherein the said first silicon dioxide film is etched back by wet etch process.

7. The method according to claim 1, wherein the thickness of the said first silicon dioxide film ranges from 50 Å to 150 Å;

the thickness of the said second silicon dioxide film is larger than that of the said first silicon dioxide film.

8. The method according to claim 7, wherein the refractive index of the said first silicon dioxide film ranges from 1.8 to 2.0;

the refractive index of the second silicon dioxide film ranges from 1.46 to 1.50.

9. The method according to claim 1, wherein the first silicon dioxide film is produced by the sol gel process.

10. The method according to claim 9, wherein the raw material of the said sol gel process is tetraethoxysilane (TEOS).

11. The method according to claim 1, wherein a refractive index value of the first silicon dioxide film is close to a refractive index of normal silicon nitride.

\* \* \* \* \*